(12) United States Patent
Cojocaru et al.

(10) Patent No.: US 10,411,663 B2
(45) Date of Patent: Sep. 10, 2019

(54) GALVANICALLY ISOLATED AMPLIFIERS AND RELATED METHODS

(71) Applicant: Solantro Semiconductor Corp., Ottawa (CA)

(72) Inventors: Christian Cojocaru, Ottawa (CA); Igor Miletic, Ottawa (CA); Tudor Lipan, Ottawa (CA); Michael Sawires, Ottawa (CA)

(73) Assignee: SOLANTRO SEMICONDUCTOR CORP., Ottawa (CA)

( * ) Notice: Subject to any disclaimer, the term of this patent is extended or adjusted under 35 U.S.C. 154(b) by 0 days.

(21) Appl. No.: 15/811,771

(22) Filed: Nov. 14, 2017

(65) Prior Publication Data

US 2018/0323759 A1    Nov. 8, 2018

Related U.S. Application Data

(60) Provisional application No. 62/422,153, filed on Nov. 15, 2016.

(51) Int. Cl.
*H03F 3/45* (2006.01)
*H03F 3/19* (2006.01)
*H03F 3/195* (2006.01)

(52) U.S. Cl.
CPC .......... *H03F 3/45071* (2013.01); *H03F 3/19* (2013.01); *H03F 3/195* (2013.01); *H03F 3/45475* (2013.01); *H03F 3/45982* (2013.01); *H03F 2200/271* (2013.01); *H03F 2200/273* (2013.01); *H03F 2200/336* (2013.01); *H03F 2200/375* (2013.01); *H03F 2200/426* (2013.01); *H03F 2200/451* (2013.01); *H03F 2200/462* (2013.01); *H03F 2203/45212* (2013.01)

(58) Field of Classification Search
CPC .. H03F 3/45071; H03F 3/19; H03F 2200/336; H03F 2200/426; H03F 2200/462; H03F 2200/375; H03F 2200/451; H03F 2200/273; H02F 2203/45212
See application file for complete search history.

(56) References Cited

U.S. PATENT DOCUMENTS 7,385,443 B1 *  6/2008  Denison ............... H03F 3/38
                                                  330/10
9,592,665 B1 *  3/2017  Vasic .................. B41J 2/04541
(Continued)

*Primary Examiner* — Dac V Ha
(74) *Attorney, Agent, or Firm* — Barnes & Thornburg LLP

(57) ABSTRACT

A Galvanically Isolated Amplifier (GIA) includes an isolation barrier to galvanically isolate high voltage circuitry from low voltage circuitry. The high voltage circuitry has at least two voltage supply rails, with the voltage supply rail closest to ground potential at a first potential relative to the ground potential. The low voltage circuitry has at least two voltage supply rails, with the voltage supply rail closest to the ground potential at a second potential, the second potential being smaller than the first potential. A Radio Frequency (RF) carrier is digitally Phase Shift Keying (PSK) modulated for transmission across the isolation barrier. The unmodulated RF carrier could also be transmitted across the isolation barrier. PSK modulation could be applied to the RF carrier based on a test waveform to generate a PSK-modulated test signal for transmission while a voltage transient is applied between the high voltage circuitry and the low voltage circuitry.

20 Claims, 6 Drawing Sheets

(56) References Cited

U.S. PATENT DOCUMENTS

| | | | |
|---|---|---|---|
| 9,998,301 B2* | 6/2018 | Yun | H04L 25/0276 |
| 2011/0028104 A1* | 2/2011 | Giombanco | H04L 25/0266 |
| | | | 455/78 |
| 2016/0197587 A1* | 7/2016 | Arknæs-Pedersen | H03F 1/565 |
| | | | 381/82 |
| 2016/0226552 A1* | 8/2016 | Jin | H03F 1/0227 |
| 2017/0086281 A1* | 3/2017 | Avrahamy | C02F 1/42 |
| 2017/0358993 A1* | 12/2017 | Ragonese | H02M 3/33553 |

* cited by examiner

GALVANICALLY ISOLATED AMPLIFIERS AND RELATED METHODS

CROSS-REFERENCE TO RELATED APPLICATION

The present application is related to, and claims the benefit of, U.S. Provisional Application No. 62/422,153, entitled "Galvanic Isolated Amplifier using BPSK Signaling", and filed on Nov. 15, 2016, the entire contents of which are incorporated herein by reference.

TECHNICAL FIELD

The present application relates generally to differential electronic amplifiers. More specifically, the present application relates to galvanically isolated amplifiers and a novel data transmission scheme across an isolation barrier.

BACKGROUND

Galvanically Isolated Amplifiers (GIAs) are used in Switching Mode Power Supplies (SMPSs). Examples of SMPSs include: Direct Current (DC) converters which convert one DC voltage to a different DC voltage, DC power supplies which convert Alternating Current (AC) to DC, inverters which convert DC to AC and bi-directional power converters such as battery inverters which both convert DC to AC and AC to DC. High voltage (HV) circuitry of many SMPSs is normally galvanically isolated from low voltage control logic circuitry. One application of a GIA is to sense and measure currents or voltages in the high voltage circuitry of an SMPS and provide an equivalent analog signal to the low voltage control circuitry.

A GIA could need a wide bandwidth or equivalently a short input-to-output propagation delay to allow for a stable SMPS control loop. Another important GIA parameter could be "dV/dt immunity", which refers to the GIA's ability to pass an undistorted signal across the SMPS's isolation barrier when there is a significant change in voltage with time (dV/dt) between the high voltage circuitry of the SMPS and its low voltage circuitry.

SUMMARY

According to an aspect of the present disclosure, a GIA includes: high voltage circuitry having at least two voltage supply rails, the voltage supply rail closest to ground potential at a first potential relative to the ground potential; low voltage circuitry having at least two voltage supply rails, the voltage supply rail closest to the ground potential at a second potential relative to the ground potential, the second potential being smaller than the first potential; and an isolation barrier, coupled between the high voltage circuitry and the low voltage circuitry, to galvanically isolate the high voltage circuitry and the low voltage circuitry from each other, one of the high voltage circuitry and the low voltage circuitry comprising a digital Phase Shift Keying (PSK) modulator, coupled to the isolation barrier, to modulate a Radio Frequency (RF) carrier for transmission of a PSK-modulated signal across the isolation barrier.

Another aspect relates to a method that involves: in one of high voltage circuitry and low voltage circuitry that are galvanically isolated from each other by an isolation barrier in a GIA, with the high voltage circuitry having at least two voltage supply rails and the voltage supply rail that is closest to ground potential being at a first potential relative to the ground potential and the low voltage circuitry having at least two voltage supply rails with the voltage supply rail that is closest to the ground potential at a second potential relative to the ground potential, the second potential being smaller than the first potential, applying digital PSK modulation to an RF carrier to generate a PSK-modulated signal; and transmitting the PSK-modulated signal across the isolation barrier.

According to a further aspect of the disclosure, a method involves: in one of high voltage circuitry and low voltage circuitry that are galvanically isolated from each other by an isolation barrier in a GIA, with the high voltage circuitry having at least two voltage supply rails and the voltage supply rail that is closest to ground potential being at a first potential relative to the ground potential and the low voltage circuitry having at least two voltage supply rails with the voltage supply rail that is closest to the ground potential at a second potential relative to the ground potential, the second potential being smaller than the first potential, applying digital PSK modulation to an RF carrier based on a test waveform to generate a PSK-modulated test signal; applying a voltage transient between the high voltage circuitry and the low voltage circuitry; transmitting the PSK-modulated test signal across the isolation barrier; measuring an output of the GIA; and measuring a deviation of the output of the GIA relative to an expected output based on the test waveform.

Other aspects and features of embodiments of the present disclosure will become apparent to those ordinarily skilled in the art upon review of the following description.

DETAILED DESCRIPTION

All illustrations of the drawings are for the purpose of describing selected embodiments of the present invention and are not intended to limit the scope of the present invention.

Figure 1:
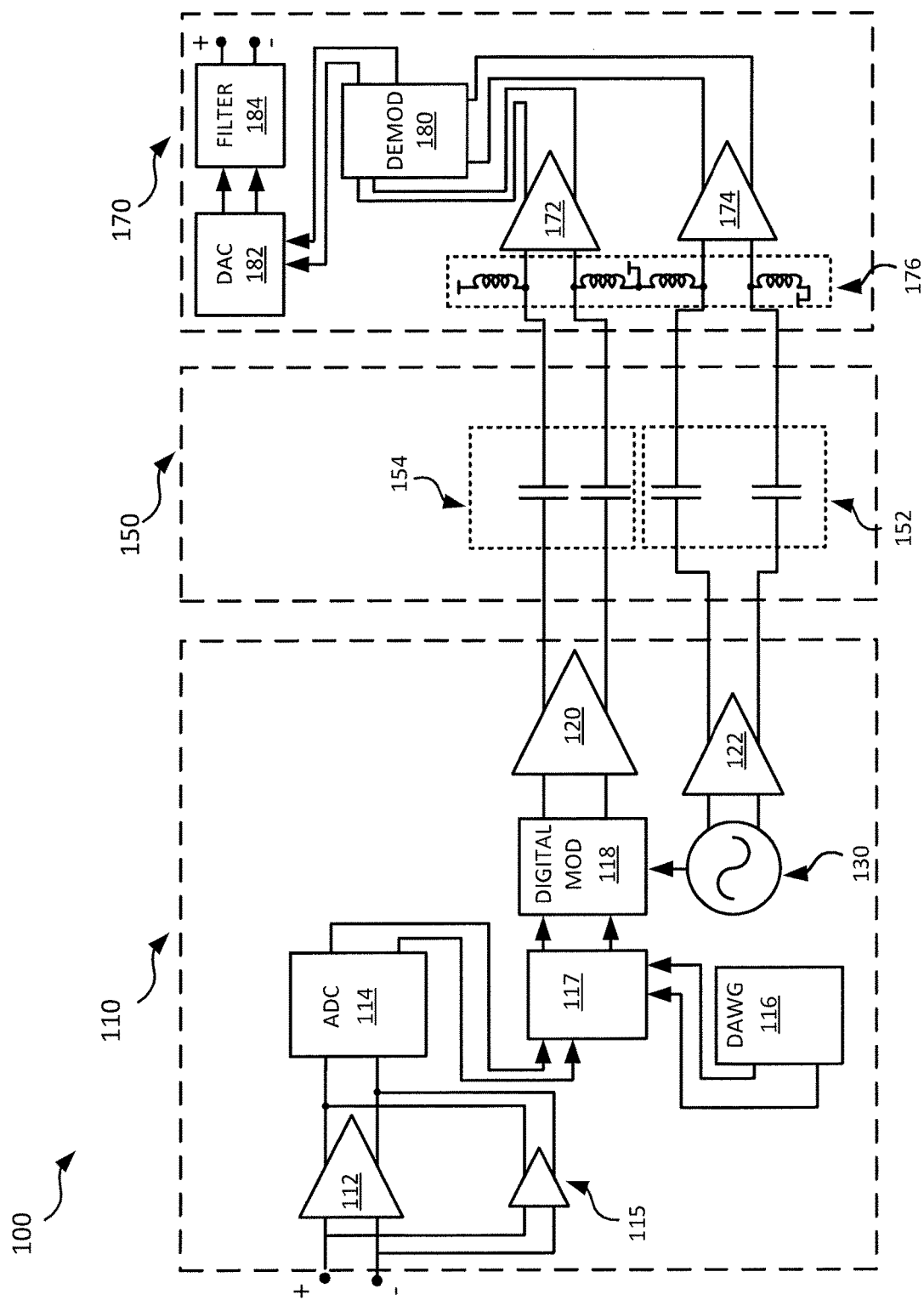
FIG. 1 is a block diagram of an example GIA.

FIG. 1 is a block diagram of an example GIA 100. The GIA 100 comprises three blocks of circuitry: a High-Voltage (HV) block 110, an Isolation (Iso) block 150 and a Low-Voltage (LV) block 170. In one embodiment, the three circuit blocks are implemented on three separate and individual silicon dice. In another embodiment HV block 110 is implemented on one silicon die and Iso block 150 and LV block 170 are implemented on a second silicon die. In another embodiment LV block 170 is implemented on one silicon die and Iso block 150 and HV block 110 are implemented on a second silicon die.

HV block 110 performs input signal amplification, analog-to-digital conversion (ADC) and BPSK modulation of a locally generated radio-frequency (RF) carrier in the embodiment shown.

Iso block 150 provides galvanic isolation between HV block 110 and LV block 170 and comprises first isolation capacitor pair 152 and second isolation capacitor pair 154 in the embodiment shown. Capacitor pairs 152, 154 are selected to withstand high-voltages between the HV block and the LV block.

LV block 170 performs common mode noise filtering, modulated signal receiving and demodulation, analog signal reconstruction (digital-to-analog conversion, DAC), low-pass filtering and driving of an output load in the GIA 100.

Although 110 is referred to as a "High Voltage" block, it is important to understand that this terminology does not refer to the supply voltage of the block but rather to the voltage difference between the circuit block's lower supply rail (often referred to symbolically as "VSS") and ground potential. For example, HV block 110 could be at a large positive potential (e.g. >350V) relative to ground or a large negative potential (e.g. <−350V) relative to ground.

The supply voltage of HV block 110 could be actually be quite low, 3.3 V for example.

Similarly, 170 is referred to as a "Low Voltage" block and this terminology refers to the voltage of the circuit's lower supply rail relative to ground and not to its supply voltage. For example, the lower supply rail of the LV block 170 could be at zero potential relative to ground.

High-Voltage Block

HV block 110 comprises Front-End Amplifier (FEA) 112, Analog-to-Digital Converter (ADC) 114, offset zeroing circuit 115, Digital Arbitrary Waveform Generator (DAWG) 116, selector 117, digital modulator 118, first output driver 120, Radio-Frequency local Oscillator (RF-Osc) 130, and second output driver 122.

FEA 112 receives a differential analog input signal and amplifies it. In one embodiment FEA 112 has a gain of 20. FEA 112 could be a wide-band, low-noise and low offset amplifier, various examples of which will be familiar to those skilled in the art. A differential input signal could be generated by a shunt resistor (not shown) placed across the input terminals of FEA 112. The shunt resistor could convert a current passing through it into a voltage signal. In one embodiment, the differential input signal is an AC signal with a peak-to-peak voltage of 20 mV. Such a resistor could be a sensing resistor to enable current sensing in an SMPS, for example.

Offset zeroing circuit 115 could perform an Auto-Zero (AZ) function for FEA 112, whereby it periodically reduces or cancels input offset in FEA 112. In one embodiment, offset zeroing circuit 115 cancels the offset at a rate of 2,000 times per second (2 kHz). Input offset refers to any non-zero voltage value at the output of an amplifier, such as FEA 112, when the voltage at its input is zero. A non-zero offset could produce undesirable effects such as a reduction in the dynamic range of FEA 112 and/or error in any control loop which uses the amplifier's output as a control signal. Input off-set has a variety of sources including temperature induced drift of the electrical parameters of a circuit's components, for example.

ADC 114 receives the amplified input signal from FEA 112 and digitizes that signal. In one embodiment ADC 114 is a Continuous-Time Delta-Sigma ADC (CTDS-ADC). ADC 114 could have a single-bit output, or a multi-bit output for higher resolution. In the case of a multi-bit output, the CTDS-ADC could be followed by a digital Delta-Sigma Modulator (DSM) to convert the multi-bit parallel word to a single-bit output bit-stream at the same data rate. A one bit output could be easier to transmit across an isolation barrier since it only requires a single physical transmission channel. A multi-bit output could require multiple physical transmission channels if the bits are transmitted in parallel and could therefore be more complex.

Selector 117 receives the bit-stream output of ADC 114 and, if the ADC output is selected, passes it to digital modulator 118. Selector 117 could be implemented in any of various ways. Those skilled in the art will be familiar with examples of various forms of selectors that could be used to implement selector 117.

RF-Osc 130 generates an RF carrier signal. In one embodiment, the frequency of the carrier is 720 MHz. In one embodiment RF-Osc 130 is a free running oscillator without a reference. In another embodiment, a Phase-locked loop (PLL) is used to tie the output frequency of RF-Osc 130 to a reference signal which could be supplied by an off-chip crystal oscillator (not shown), for example.

Digital modulator 118 modulates the RF carrier received from RF Osc 130 with the bit-stream generated by ADC 114. In one embodiment, digital modulator 118 is a Phase Shift Keying (PSK) modulator that uses PSK to modulate the RF carrier. In Phase Shift Keying modulation, the logic symbols to be transmitted are represented by different phase values of the modulated carrier. Those skilled in the art will be familiar with examples of PSK modulators that could be used as digital modulator 118.

PSK could have greater immunity to dV/dt transients than other modulation methods such as, for example, Amplitude Shift Keying or Pulse Width Modulation. A dV/dt transient can induce a change in the amplitude of a signal transmitted across the isolation barrier and could therefore induce errors in any signal in which logic symbols depend on the signal amplitude. The phase of a signal transmitted across the isolation barrier is typically affected to a lesser extent, if at all, by a dV/dt transient. This greater immunity to dV/dt transients could justify the greater circuit complexity of a PSK modulation method compared to some other modulation methods.

Binary Phase Shift Keying (BPSK) is a type of PSK. In BPSK there are only two logic symbols transmitted (logic "0" and "1") and they could be represented by, for example, phase differences of 90 degrees leading and 90 degrees lagging, respectively. In one embodiment, the data-rate of the output bit-stream of digital modulator 118 is chosen to be one quarter of the RF carrier frequency. The length of a logic "0" or "1" in this embodiment is four cycles of the RF carrier.

The modulated carrier from digital modulator 118 is received by first output driver 120 and transmitted to LV block 170 through first isolation capacitor pair 152. Driver 120 provides the necessary current drive to transmit the modulated carrier off-chip through the isolation capacitance and produce a signal of sufficient amplitude at the input to amplifier 172. Driver 120 could be a current amplifier, for example. The unmodulated RF carrier from RF-Osc 130 is also transmitted to LV block 170 by second driver 122 through second isolation capacitor pair 154. Sending the unmodulated carrier could simplify demodulation of the modulated carrier in LV block 170 since the carrier does not then need to be recovered from the modulated signal.

The HV block 110 also comprises Digital Arbitrary Waveform Generator (DAWG) 116. DAWG 116 could be used to facilitate testing the effect of dV/dt transients, between HV block 110 and LV block 170, on the bit error rate of data transmitted from HV block 110 to LV block 170. DAWG 116 could be implemented as a signal generator that is controllable to supply any of a variety of reference waveforms, for example, a sine wave, a square wave or a triangular wave.

DAWG 116 could eliminate the need for an external arbitrary waveform generator to produce a test waveform at the input to GIA 100. An external waveform generator could introduce a large capacitance between the HV block 110 and the LV block 170, which could limit the maximum dV/dt test value that could be applied.

Isolation Block

Isolation block 150 comprises first isolation capacitor pair 152 and second isolation capacitor pair 154. In one embodiment capacitor pairs 152, 154 are on a silicon die separate from HV block 110 and LV block 170. Capacitor pairs 152, 154 could instead be implemented on the same die as either or both of HV block 110 and LV block 170.

In one embodiment, capacitor pairs 152, 154 are vertical, metal to metal, on-chip capacitors manufactured using a conventional integrated circuit processing. The metal capacitor plates and intervening dielectric layer could be deposited by any of a variety of known deposition techniques including: chemical vapor deposition, sputtering or electroplating. To achieve a high capacitor breakdown voltage, additional wafer processing steps to increase the thickness of the dielectric between the two capacitor plates could be used. In one embodiment, a 22-micron thick silicon dioxide deposition is used. In one embodiment, first and second isolation capacitor pairs 152, 154 are implemented using capacitive elements that each have a capacitance value of 50 fF. As an illustrative example, elements with voltage ratings of 10 kVDC and 4.5 kVAC could be used in embodiments with expected HV block 110 maximum voltage of <250VDC, to withstand expected high-voltage levels and also provide for a safety factor, for example.

Isolation block 150 need not necessarily use capacitors as isolation elements. In another embodiment, a pair of on-chip transformers (one for the unmodulated RF carrier and one for the modulated carrier) could be used.

Low-Voltage Block

LV block 170 comprises RF receivers 172, 174, inductors 176, digital demodulator 180, one-bit DAC 182 and filter 184. RF receivers 172, 174 receive modulated and unmodulated RF signals, respectively, from first driver 120 and second driver 122 of HV block 110. Receivers 172, 174 each have a pair of large inductors 176 connected to their inputs to filter (shunt) common-mode noise, generated by dV/dt voltage transients for example, while still passing the modulated and unmodulated RF signals.

Common mode noise refers to a non-zero voltage appearing at both input terminals of an amplifier or, in the example shown, the input terminals of a receiver. Common mode noise could compromise the performance of a receiver 172, 174 by causing distortion or clipping of its output signal, for example.

In one embodiment inductors 176 each have identical values of 100 nH. Inductors 176 could have a power dissipation advantage and provide better dV/dt immunity over alternative solutions to the dV/dt common mode noise such as wide-band active circuits which try to keep the common-mode receiver input within the desired range. In one embodiment, each inductor 176 is connected between a positive voltage supply for LV block 170 and a respective input terminal of a receiver 172, 174. In other embodiments, inductors 176 could instead connect to a negative LV block voltage supply.

RF receivers 172, 174 amplify and limit their input signals to generate digital (square wave) versions of the unmodulated carrier and modulated signal. Those skilled in the art will be familiar with examples of amplifiers or other elements that could be used as receivers 172, 174.

Digital demodulator 180, which could be a PSK modulator or BPSK modulator for example, receives the two digital signals from receivers 172, 174 and recovers the original digital bit-stream generated by ADC 114 in HV block 110. Demodulator 180 could include error correction. In one embodiment, a BPSK demodulator at 180 corrects for single bit errors, which could be the result of receiver channel saturation due to a dV/dt event, for example.

The demodulated bit-stream is supplied to DAC 182, a one-bit DAC in an embodiment, which converts the two voltage levels of the digital bit-stream (representing "0" and "1") into two analog levels suitable for analog processing. DAC 182 could be implemented, for example, as four transmission gate switches commutating between two reference voltage sources under the control of the single bit digital sequence. One reference could be the circuit ground (i.e. 0V), while the other could be a voltage level chosen to define the amplitude of the output signal. Alternatively, one reference voltage could be of one polarity and the second reference could be of equal value but of opposite polarity to produce analog levels symmetric about the circuit ground.

The output of DAC 182 is received by filter 184. In one embodiment filter 184 is a sixth order, low-pass filter with a 3 dB cut-off frequency greater than 1 MHz. Filter 184 reduces or removes the quantization noise introduced by the ADC 114 and reconstructs an amplified version of original differential analog signal received at the input of FEA 112. Filter 184 could also incorporate power driver functionality. In one embodiment, filter 184 can drive a large (50 pF) external capacitive load with very small distortion.

Packaging

HV block 110, Iso block 150 and LV block 170 could be implemented on one or more dice. These blocks could be implemented as three separate and individual silicon dice, for example. In another embodiment HV block 110 is implemented on one silicon die and Iso block 150 and LV block 170 are implemented on a second silicon die. In another embodiment LV block 170 is implemented on one silicon die and Iso block 150 and HV block 110 are implemented on a second silicon die.

Figure 2:
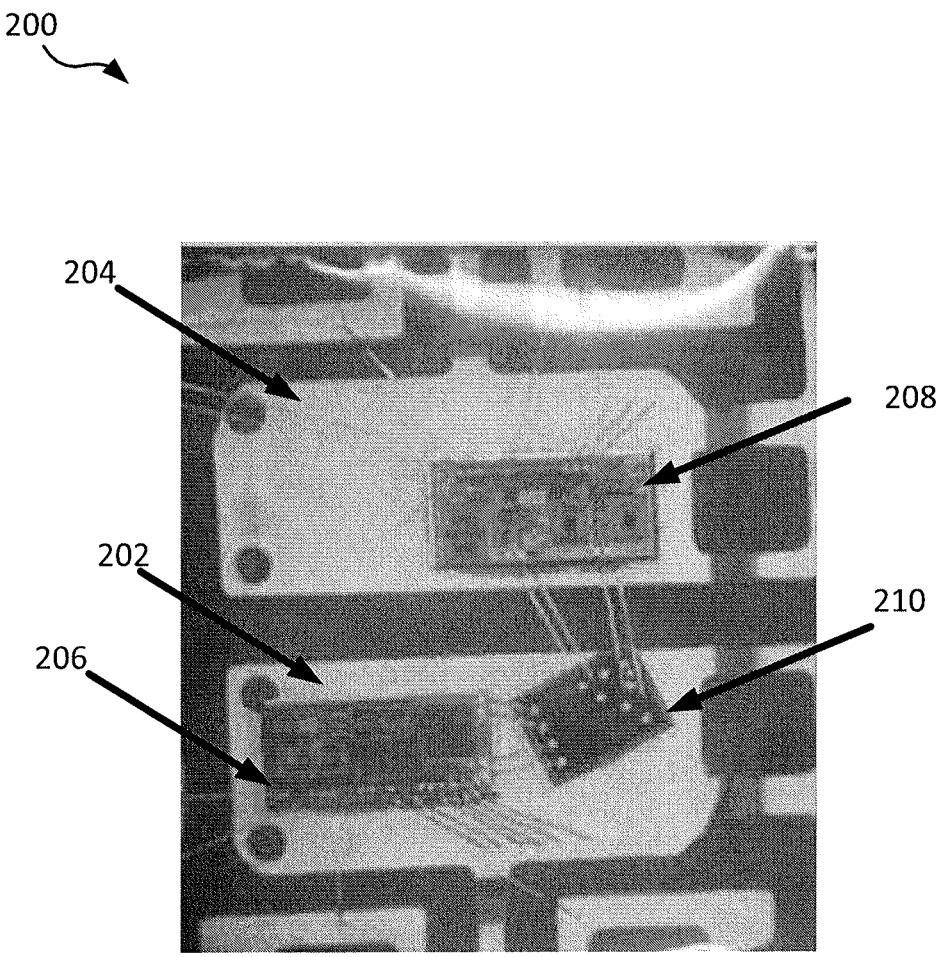
FIG. 2 is a photograph of a packaged multi-die GIA.

In multiple-die embodiments, the dice could be packaged in a single die package. FIG. 2 is a photograph of an example die package. Die package 200 comprises first metal die paddle 202, second metal die paddle 204, High-Voltage die 206, Low-Voltage die 208 and isolation die 210. High-Voltage die 206 comprises HV circuit block 110 of FIG. 1, Low-Voltage die 208 comprises LV block 170 of FIG. 1, and isolation die 210 comprises Iso block 150 of FIG. 1. High-Voltage die 206 and Iso die 210 share first die paddle 202 and Low-Voltage die is supported by second die paddle 204.

Other packaging options are also contemplated.

Overview and Methods of Operation

In accordance with the present disclosure, a GIA includes high voltage circuitry, low voltage circuitry, and an isolation barrier. The high voltage circuitry has at least two voltage supply rails, and the high voltage circuitry voltage supply rail that is closest to ground potential (e.g., VSS in an example above) is at a first potential relative to the ground potential. The low voltage circuitry also has at least two voltage supply rails, and the low voltage circuitry voltage supply rail that is closest to the ground potential (e.g., VSS) is at a second potential relative to the ground potential. The second potential is smaller than the first potential. The isolation barrier is coupled between the high voltage circuitry and the low voltage circuitry, to galvanically isolate the high voltage circuitry and the low voltage circuitry from each other. This is shown in FIG. 1, in which the HV block 110, the LV block 170, and the Iso block 150 are illustrative examples of high voltage circuitry, low voltage circuitry, and an isolation barrier.

The high voltage circuitry or the low voltage circuitry could include a digital PSK modulator such as a BPSK modulator, coupled to the isolation barrier, to modulate an RF carrier for transmission of a PSK-modulated signal across the isolation barrier. In FIG. 1, the high voltage circuitry includes a digital PSK modulator and PSK-modulated signals are transmitted across the isolation barrier from the high voltage circuitry to the low voltage circuitry. In other embodiments, the low voltage circuitry could also or instead include a digital PSK modulator and PSK-modulated signals are transmitted across the isolation barrier from the low voltage circuitry to the high voltage circuitry.

The circuitry that includes the digital PSK modulator could also include a transmitter, coupled to the isolation barrier, to transmit the unmodulated RF carrier across the isolation barrier.

In some embodiments, the isolation barrier includes a pair of capacitors as shown in FIG. 1, and the modulated signal is transmitted between the high voltage circuitry and the low voltage circuitry through the pair of capacitors. The isolation barrier includes a transformer, or multiple transformers as described herein, in other embodiments.

A digital PSK modulator in one of the high voltage circuitry and the low voltage circuitry is coupled to one side of the isolation barrier. The other of the high voltage circuitry and the low voltage circuitry could include a receiver with inputs coupled to the other side of the isolation barrier. Inductors could also be provided, coupling the inputs of the receiver to a voltage supply of the other of the high voltage circuitry and the low voltage circuitry.

Some embodiments may support testing of a GIA. For example, the one of the high voltage circuitry and the low voltage circuitry that includes the digital PSK modulator could also include a DAWG and a selector as shown in FIG. 1. The selector has respective inputs coupled to an input of the GIA and to the DAWG and an output coupled to the digital PSK modulator, to select between providing the input of the GIA to the digital PSK modulator during normal operation of the GIA and providing an output waveform from the DAWG to the digital PSK modulator during test mode operation of the GIA.

Input offset zeroing could also or instead be implemented in some embodiments. A GIA could include offset zeroing circuitry to reduce input offset at an input of the GIA. This is shown by way of example at 115 in FIG. 1, in the HV block 110. In other embodiments, a GIA input could be an input to low voltage circuitry, and offset zeroing could then be implemented in the low voltage circuitry.

A GIA could include at least a first semiconductor die implementing the high voltage circuitry and a second semiconductor die implementing the low voltage circuitry. The isolation barrier could be implemented with the high voltage circuitry on the first semiconductor die, or with the low voltage circuitry on the second semiconductor die. In other embodiments, a GIA includes a third semiconductor die implementing the isolation barrier.

Embodiments are described above primarily in the context of example apparatus or devices. Method embodiments are also contemplated.

For example, in one embodiment a method involves, in one of high voltage circuitry and low voltage circuitry that are galvanically isolated from each other by an isolation barrier in a GIA, applying digital PSK modulation to an RF carrier to generate a PSK-modulated signal, and transmitting the PSK-modulated signal across the isolation barrier. Such a method could also involve transmitting the unmodulated RF carrier across the isolation barrier. The high voltage circuitry has at least two voltage supply rails and the high voltage circuitry voltage supply rail that is closest to ground potential is at a first potential relative to the ground potential, and the low voltage circuitry has at least two voltage supply rails and the low voltage circuitry voltage supply rail that is closest to the ground potential is at a second potential relative to the ground potential, the second potential being smaller than the first potential.

The PSK modulation could be BPSK modulation, for example.

The isolation barrier could include a pair of capacitors, in which case the transmitting involves transmitting the modulated signal through the pair of capacitors. The isolation barrier could instead include other components, such as a transformer, and the transmitting then involves transmitting the modulated signal through the transformer.

A method could include testing operations, such as generating a test waveform, applying the digital PSK modulation to the RF carrier based on the test waveform to generate a PSK-modulated test waveform, and transmitting the PSK-modulated test waveform across the isolation barrier.

Another example of testing involves selecting between an input of the GIA and a test waveform for modulation. The applying could then involve applying the PSK modulation to the RF carrier based on the selected one of the input of the GIA and the test waveform to generate the PSK-modulated signal.

A method could also include applying offset zeroing to reduce input offset at an input of the GIA.

Figure 3:
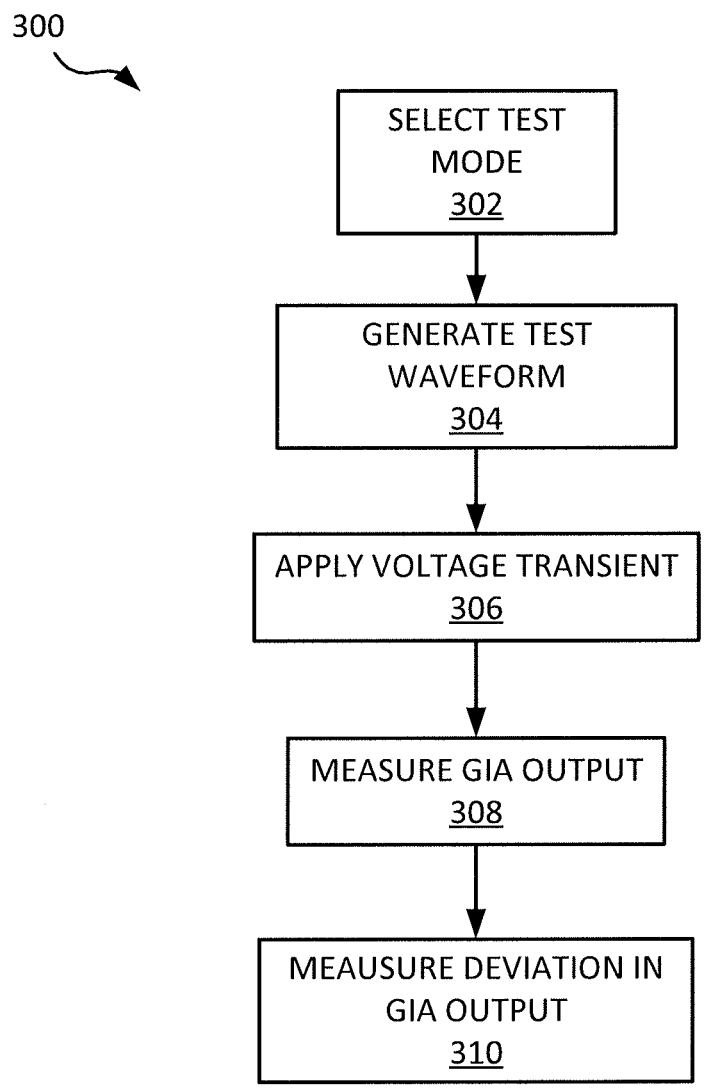
FIG. 3 is a flow diagram of an example GIA dV/dt testing method.

FIG. 3 is a flow diagram of an example GIA dV/dt testing method 300. At 302, a test mode is selected. This could involve, for example, controlling selector 117 (FIG. 1) to select the bit-stream output of DAWG 116 as input to digital modulator 118.

Selector 117 and DAWG 116 could be controlled externally. For example, control signals could be sent through the differential input to Front-End Amplifier (FEA) 112 to control HV block 110 and through differential output of Filter 184 to control LV block 170. These control paths could be activated by raising the supply voltage for HV block 110 and LV block 170 above their nominal values, for example.

In normal operation, for SMPS control for example, selector 117 selects the bit-stream output of ADC 114 as input to digital modulator 118. In test mode, at 304 the DAWG 116 starts generating a test waveform which is used by digital modulator 118 to modulate the RF carrier. The test waveform is digitally generated by DAWG 116 and its amplitude, period and frequency and could be programmable.

At 306, repetitive dV/dt voltage transients are applied to HV block 110 relative to LV block 170 by, for example, an external voltage generator while DAWG 116 is generating the test waveform. At 308, the output of GIA 100 is measured and could be recorded, by an oscilloscope for example, while DAWG 116 is generating the test waveform and while the dV/dt transients are being applied. At 310, deviation in the output of GIA 100 relative to its expected output as known from the test waveform is measured. Different deviation measurements are possible. For example, a dV/dt transient could produce a sudden "glitch" or spike in the output waveform. The maximum height or amplitude of the glitch, which could be an absolute amplitude relative to a reference or an amplitude relative to an expected output, and/or the time duration of the glitch could be measured. In this type of testing implementation, the test is in effect monitoring for spikes or glitches in a waveform of known shape, such as a sinusoid, a square wave or a triangular wave. The deviation measurements could be compared to desired or target values and could be used as production acceptance criteria, for example.

Although shown as a sequence of operations in FIG. 3, at least the operations at 304, 306, 308 are continuous and ongoing during a test. While the test waveform is being generated at 304, transients are applied at 306 and the GIA output is measured at 308. Deviation measurement at 310 could also be ongoing, or performed after other testing operations have been completed, in embodiments in which GIA output measurements that are taken at 308 are also stored for example.

FIG. 3 is illustrative of a method that involves, in one of high voltage circuitry and low voltage circuitry that are galvanically isolated from each other by an isolation barrier in a GIA, applying digital PSK modulation to an RF carrier based on a test waveform to generate a PSK-modulated test signal. Such a testing method also involves, in an embodiment, applying a voltage transient between the high voltage circuitry and the low voltage circuitry, transmitting the PSK-modulated test signal across the isolation barrier, measuring an output of the GIA, and measuring a deviation of the output of the GIA relative to an expected output based on the test waveform. As noted herein, measuring a deviation could be based on one or both of: an amplitude of a deviation and a duration of the deviation.

As described above in the context of other embodiments, the high voltage circuitry has at least two voltage supply rails and the high voltage circuitry voltage supply rail that is closest to ground potential is at a first potential relative to the ground potential, and the low voltage circuitry has at least two voltage supply rails and the low voltage circuitry voltage supply rail that is closest to the ground potential is at a second potential relative to the ground potential, the second potential being smaller than the first potential.

CONCLUSION

Although embodiments of the invention have been explained by way of example, it is to be understood that many other possible modifications and variations can be made without departing from the spirit and scope of the invention.

What has been described is merely illustrative of the application of principles of embodiments of the present disclosure. Other arrangements and methods can be implemented by those skilled in the art.

Figure 4A:
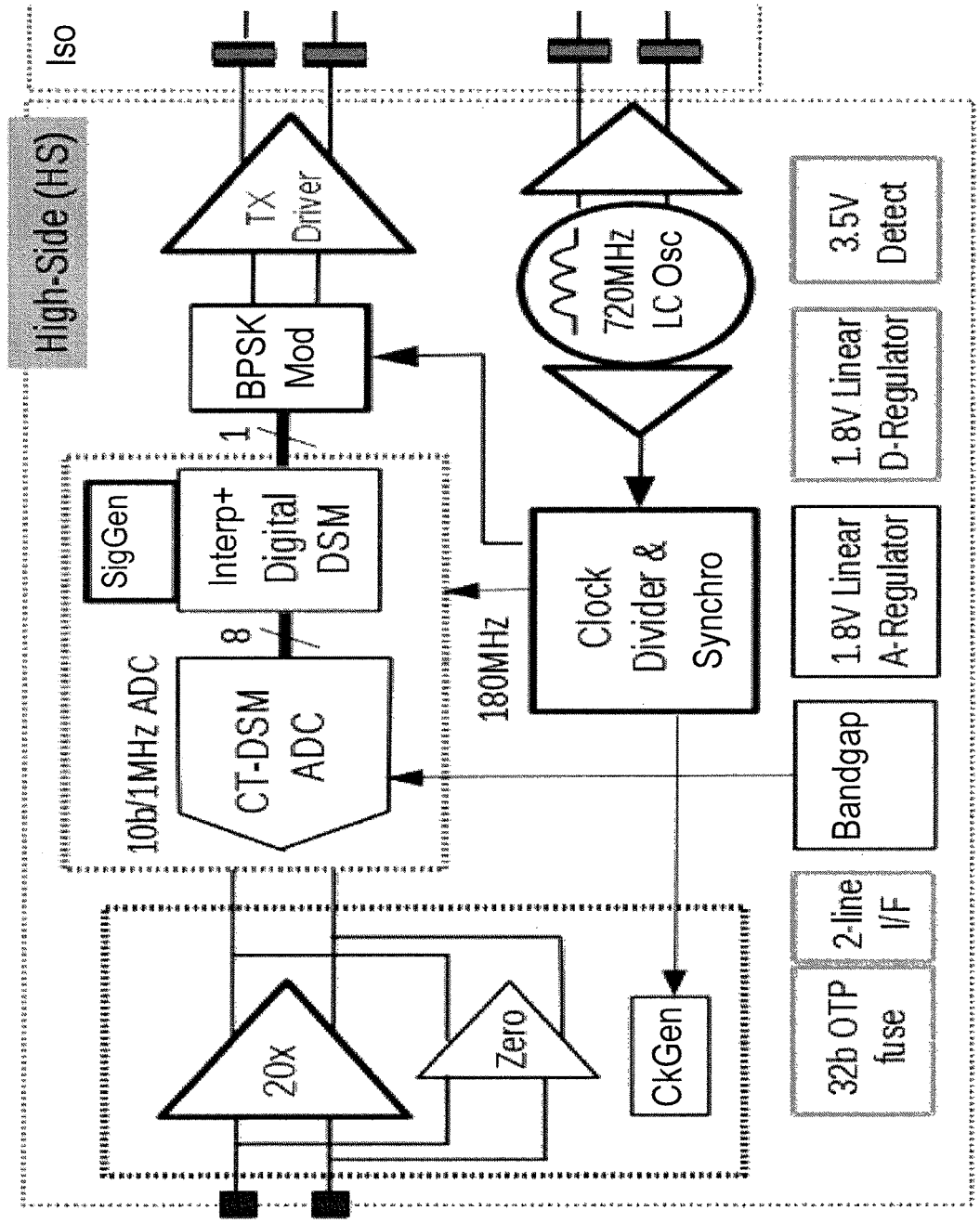
FIGS. 4A and 4B together form a block diagram of another example GIA.
Figure 4B:
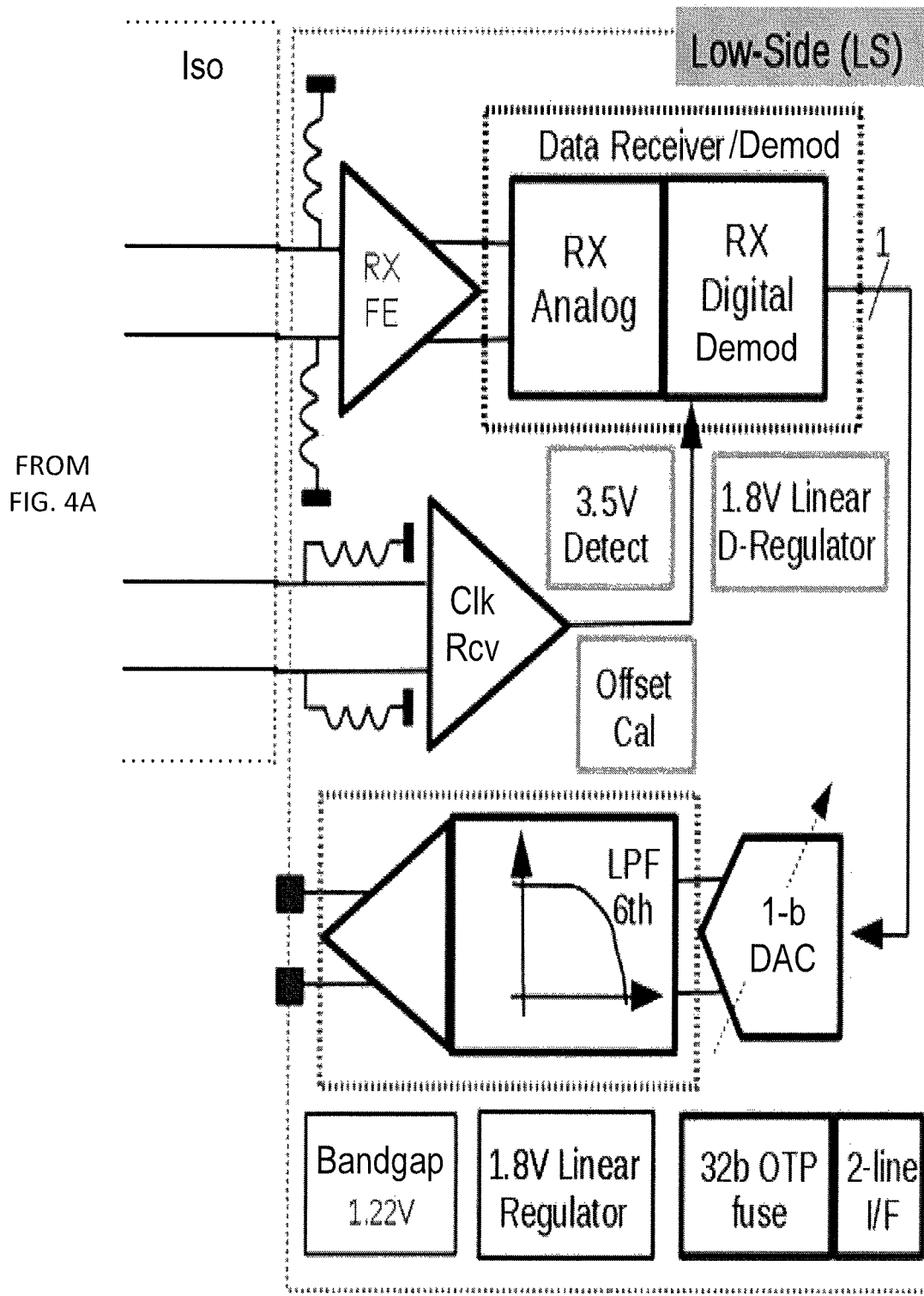
Figure 5:
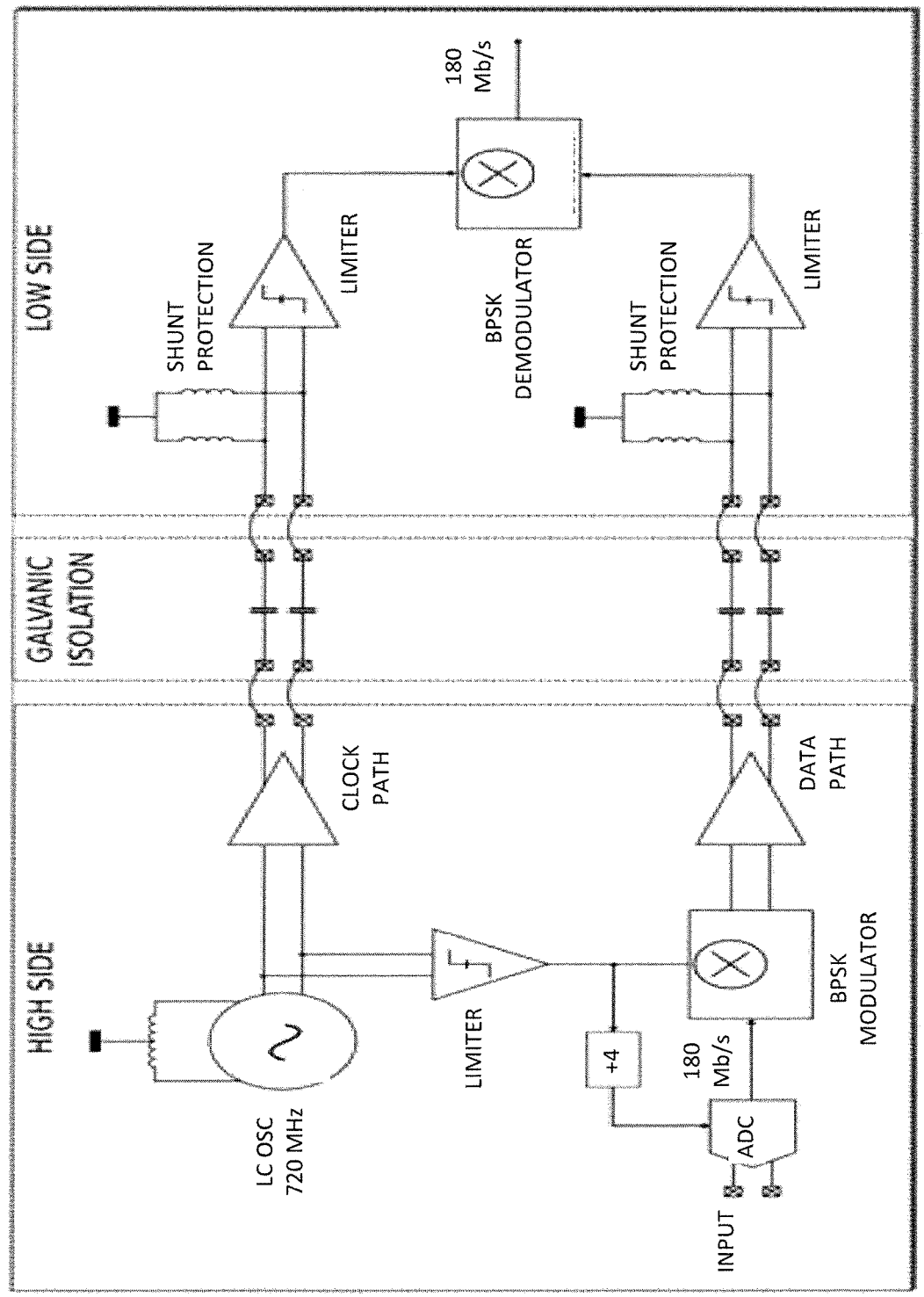
FIG. 5 is a block diagram illustrating yet another example GIA.

FIGS. 4A and 4B together form a block diagram of a further example GIA. FIG. 4A is a block diagram of the example GIA's High-Side (HS) block and ISO block. FIG. 4B is a block diagram of the GIA' s Low-Side (LS) block. FIG. 5 is a block diagram illustrating a further example GIA. The examples in FIGS. 4A/4B and 5 include high voltage circuitry and low voltage circuitry, shown in these drawings as high side circuitry and low side circuitry, and an isolation barrier labeled as Iso in FIG. 4A and galvanic isolation in FIG. 5. The particular components and details shown in FIGS. 4A, 4B and 5 are illustrative example implementations of GIAs, and are not intended to limit the present disclosure. These drawings include specific values for various parameters and specific component details, for example. Such values and details, however, relate to particular embodiments. Other embodiments could support the same or different parameter values and/or implement the same or different components.

More generally, it should be appreciated that the contents of the drawings are intended solely for illustrative purposes, and that the present invention is in no way limited to the particular example embodiments explicitly shown in the drawings and described herein. Other embodiments may include additional, fewer, and/or additional components coupled together in a similar manner as shown or in a different manner. In the case of method embodiments, operations that are described herein may be performed in a different order than shown in the drawings or described above, and other embodiments could involve additional or fewer operations. Examples of additional operations will be apparent from the description and drawings relating to system or apparatus implementations, for example, and further variations may be or become apparent. Method operations could also or instead be performed in any of various different ways, and examples of such options are also discussed with reference to apparatus or device embodiments.

What is claimed is:

1. A Galvanically Isolated Amplifier (GIA) comprising:
high voltage circuitry having at least two voltage supply rails to supply a first supply voltage to the high voltage circuitry, the voltage supply rail closest to ground potential being at a first potential relative to the ground potential;
low voltage circuitry having at least two voltage supply rails to supply a second supply voltage to the low voltage circuitry, the voltage supply rail closest to the ground potential being at a second potential relative to the ground potential, the second potential being smaller than the first potential; and
an isolation barrier, coupled between the high voltage circuitry and the low voltage circuitry, to galvanically isolate the high voltage circuitry and the low voltage circuitry from each other,
one of the high voltage circuitry and the low voltage circuitry comprising a digital Phase Shift Keying (PSK) modulator, coupled to the isolation barrier, to modulate a Radio Frequency (RF) carrier for transmission of a PSK-modulated signal across the isolation barrier.

2. The GIA of claim 1, wherein the digital PSK modulator comprises a Binary PSK (BPSK) modulator.

3. The GIA of claim 1, wherein the one of the high voltage circuitry and the low voltage circuitry further comprises a transmitter, coupled to the isolation barrier, to transmit the unmodulated RF carrier across the isolation barrier.

4. The GIA of claim 1, wherein the isolation barrier comprises a pair of capacitors, and wherein the modulated signal is transmitted between the high voltage circuitry and the low voltage circuitry through the pair of capacitors.

5. The GIA of claim 1, wherein the other of the high voltage circuitry and the low voltage circuitry comprises a receiver with inputs coupled to the isolation barrier, and inductors coupling the inputs of the receiver to a voltage supply of the other of the high voltage circuitry and the low voltage circuitry.

6. The GIA of claim 1, wherein the one of the high voltage circuitry and the low voltage circuitry further comprises:
a Digital Arbitrary Waveform Generator (DAWG); and
a selector, comprising respective inputs coupled to an input of the GIA and to the DAWG and an output coupled to the digital PSK modulator, to select between providing the input of the GIA to the digital PSK modulator during normal operation of the GIA and providing an output waveform from the DAWG to the digital PSK modulator during test mode operation of the GIA.

7. The GIA of claim 1, further comprising:
offset zeroing circuitry to reduce input offset at an input of the GIA.

8. The GIA of claim 1, wherein the isolation barrier comprises a transformer.

9. The GIA of claim 1, comprising at least a first semiconductor die implementing the high voltage circuitry and a second semiconductor die implementing the low voltage circuitry.

10. The GIA of claim 9, further comprising a third semiconductor die implementing the isolation barrier.

11. A method comprising:
in one of high voltage circuitry and low voltage circuitry that are galvanically isolated from each other by an isolation barrier in a Galvanically Isolated Amplifier (GIA), with the high voltage circuitry having at least two voltage supply rails to supply a first supply voltage to the high voltage circuitry and the voltage supply rail that is closest to ground potential being at a first potential relative to the ground potential and the low voltage circuitry having at least two voltage supply rails to supply a second supply voltage to the low voltage circuitry with the voltage supply rail that is closest to the ground potential being at a second potential relative to the ground potential, the second potential being smaller than the first potential: applying digital Phase Shift Keying (PSK) modulation to a Radio Frequency (RF) carrier to generate a PSK-modulated signal; and
transmitting the PSK-modulated signal across the isolation barrier.

12. The method of claim 11, wherein the PSK modulation comprises Binary PSK (BPSK) modulation.

13. The method of claim 11, further comprising:
transmitting the unmodulated RF carrier across the isolation barrier.

14. The method of claim 11, wherein the isolation barrier comprises a pair of capacitors, and wherein the transmitting comprises transmitting the modulated signal through the pair of capacitors.

15. The method of claim 11, further comprising:
generating a test waveform;
applying the digital PSK modulation to the RF carrier based on the test waveform to generate a PSK-modulated test waveform; and
transmitting the PSK-modulated test waveform across the isolation barrier.

16. The method of claim 11, further comprising:
selecting between an input of the GIA and a test waveform for modulation,
wherein the applying comprises applying the PSK modulation to the RF carrier based on the selected one of the input of the GIA and the test waveform to generate the PSK-modulated signal.

17. The method of claim 11, further comprising:
applying offset zeroing to reduce input offset at an input of the GIA.

18. The method of claim 11, wherein the isolation barrier comprises a transformer, and wherein the transmitting comprises transmitting the modulated signal through the transformer.

19. A method comprising:
in one of high voltage circuitry and low voltage circuitry that are galvanically isolated from each other by an isolation barrier in a Galvanically Isolated Amplifier (GIA), with the high voltage circuitry having at least two voltage supply rails and the voltage supply rail that is closest to ground potential being at a first potential relative to the ground potential and the low voltage circuitry having at least two voltage supply rails with the voltage supply rail that is closest to the ground potential being at a second potential relative to the ground potential, the second potential being smaller than the first potential, applying digital Phase Shift Keying (PSK) modulation to a Radio Frequency (RF) carrier based on a test waveform to generate a PSK-modulated test signal;
applying a voltage transient between the high voltage circuitry and the low voltage circuitry;
transmitting the PSK-modulated test signal across the isolation barrier;
measuring an output of the GIA; and
measuring a deviation of the output of the GIA relative to an expected output based on the test waveform.

20. The method of claim 19, wherein measuring a deviation is based on one or both of: an amplitude of a deviation and a duration of the deviation.

* * * * *